US006587391B2

United States Patent
Jung et al.

(10) Patent No.: US 6,587,391 B2
(45) Date of Patent: Jul. 1, 2003

(54) SEMICONDUCTOR MEMORY DEVICE FOR CONTROLLING MEMORY BANKS

(75) Inventors: Tae Hyung Jung, Seoul (KR); Kyung Duk Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/034,964

(22) Filed: Dec. 27, 2001

(65) Prior Publication Data

US 2002/0176307 A1 Nov. 28, 2002

(30) Foreign Application Priority Data

May 25, 2001 (KR) .......................................... 2001-29104

(51) Int. Cl.⁷ ................................................ G11C 8/00
(52) U.S. Cl. ............................ 365/230.03; 365/230.08
(58) Field of Search ....................... 365/230.03, 230.08, 365/203, 185.11

(56) References Cited

U.S. PATENT DOCUMENTS

| 5,241,510 A | * 8/1993 | Kobayashi et al. ..... 365/230.03 |
| 5,528,552 A | * 6/1996 | Kamisaki ............... 365/230.03 |
| 5,831,924 A | 11/1998 | Nitta et al. ............ 365/230.03 |
| 5,893,158 A | 4/1999 | Furuta ....................... 711/150 |
| 5,959,929 A | 9/1999 | Cowles et al. ......... 365/230.03 |
| 5,970,016 A | 10/1999 | Ohsawa .................. 365/230.03 |
| 5,973,991 A | 10/1999 | Tsuchida et al. ............ 365/233 |
| 6,028,812 A | * 2/2000 | Tanaka ................... 365/230.03 |
| 6,049,502 A | 4/2000 | Cowles et al. ......... 365/230.03 |
| 6,075,747 A | 6/2000 | Won ....................... 365/230.06 |
| 6,078,536 A | 6/2000 | Moon et al. ................. 365/201 |
| 6,119,181 A | 9/2000 | Vorbach et al. ............. 710/100 |
| 6,125,422 A | 9/2000 | May ............................... 711/5 |
| 6,141,290 A | 10/2000 | Cowles et al. ......... 365/230.06 |
| 6,141,765 A | 10/2000 | Sherman ..................... 713/400 |
| 6,154,826 A | 11/2000 | Wulf et al. .................. 711/217 |
| 6,185,150 B1 | 2/2001 | Toda et al. .................. 365/233 |

FOREIGN PATENT DOCUMENTS

| JP | 60186949 | 9/1985 |
| JP | 7221762 | 8/1995 |
| JP | 149598 | 5/2000 |

* cited by examiner

Primary Examiner—Tan T. Nguyen
(74) Attorney, Agent, or Firm—Ladas & Parry

(57) ABSTRACT

A semiconductor memory device for performing a dependent bank operation comprises a plurality of banks consisting of memory cells; a plurality of address latch circuits, shared by two adjacent banks respectively, for receiving global address signals and latching local address signals of the selected bank; and a plurality of control circuits, shared by two adjacent banks respectively, for generating control signals and determining the specific bank that is to be activated.

8 Claims, 4 Drawing Sheets

SEMICONDUCTOR MEMORY DEVICE FOR CONTROLLING MEMORY BANKS

BACKGROUND OF THE INVENTION

1. Field of the Invention

The present invention relates to a bank control circuit in a Rambus DRAM capable of reducing circuit area by disposing one control circuit and one address latch circuit in every two banks.

2. Description of the Related Art

FIG. 1 is a block diagram of a conventional Rambus DRAM comprising: memory blocks 10 including an upper and a lower memory block units 12, 14 comprising 16 memory banks respectively; an upper and a lower series/parallel shifter units 16, 18 for performing series/parallel conversion to interface write and read data of the memory bank with outside; an input/output terminal 20 for outputting read data received through the upper and lower series/parallel shifter units 16, 18 to outside and for outputting write data received from outside to the upper and lower series/parallel shifter units 16, 18; and a control unit 22 for controlling operations of the upper and lower series/parallel shifter units 16, 18.

The memory blocks 10 have 32 memory banks, including the upper memory block unit 12 and the lower memory block unit 14 comprising 16 banks respectively.

The upper series/parallel shifter unit 16 converts 128 bit parallel data RDA_top[127:0] read in the upper memory block unit 12 to 16 bit data EvenRDA_top[7:0], OddRDA_top[7:0] and outputs the result and the lower series/parallel shifter unit 18 converts 128 bit parallel data RDA_bot[127:0] read in the lower memory block unit 14 to 16 bit data Even RDA_bot [7:0], OddRDA_bot [7:0] and outputs the result.

The upper and lower series/parallel shifter units 16, 18 generally perform two operations. One of them is series-parallel conversion for converting 8 bit series data input 8 times in write operation to 128 bit and the other is parallel-series conversion for converting 128 bit data read from memory block in read operation to 8 bit×8.

In a write operation, two upper and lower series/parallel shifter units 16, 18 simultaneously transmit inputted write data to the upper memory block unit 12 and the lower memory block unit 14 respectively and only the data selected by write address are recorded in the memory block 10. And, in read operation, two upper and lower series/parallel shifter units 16, 18 receive read data through each memory block 10 and transmit them to output terminal.

FIG. 2 is a block diagram of conventional memory bank control circuit disposed in the upper memory block 12 (or in the lower memory block 14) shown in FIG. 1. As illustrated, the conventional memory bank control circuit comprises: 16 memory bank units 30<0>~30<15> for storing data; 17 sense amp units 40<0>~40<16> disposed on upper parts and lower parts of each memory bank for sensing data in write and read operations; 17 sense amp driver units 50<0>~50<16> for respectively controlling operations of the sense amp units 40<0>~40<16>; ≠main word line and sub word line driver units 60<0>~60<15> for driving word lines and sub word lines of the memory bank units 30<0>~30<15>; and 16 control units and address latch units 70<0>~70<15> for receiving active signals, precharge signals and global address signals from outside and generating sense amp control signals corresponding to address signals to control sense amp driver unit, main word line and sub word line driver unit and bit lines in memory bank, main word line control signals, sub word line control signals and bit line equalizing signals.

One control unit and one address latch unit are disposed in every memory bank unit 30<0>~30<15>. When the active signal and the precharge signal are generated as global signals, the control unit and the address latch unit 70<0>~70<15> of each memory bank check whether or not the received global address signals are address signals of its memory bank and then if the bank addresses correspond to each other, the memory banks are controlled to operate in active mode or precharge mode. That is, the control unit corresponding to the bank address and the address latch unit operate main word line and sub word line driver units of the relevant memory bank and 2 sense amp driver units on the upper and the lower parts of the relevant memory bank. Here, the control unit and the address latch unit selected by the bank address maintain word lines in the memory bank although external global address signals are changed by latching addresses received in active mode.

When nth memory bank 30<n> is selected by the global address signal, all of (n−1)th, nth and (n+1)th memory banks 30<n−1>, 30<n>, 30<n+1> are precharged and then the nth memory bank 30<n> is activated. For example, if memory bank 1 30<1> is selected, then memory bank 0 30<0>, memory bank 1 30<1> and memory bank 2 30<2> are all precharged and then memory bank 1 30<1>is activated. And, when the memory bank 1 30<1> is activated, the memory bank 0 30<0> and the memory bank 2 30<2> are not activated until the memory bank 1 30<1> is precharged.

However, the conventional bank control unit of Rambus DRAM has several drawbacks. For example, there is a problem of increased layout area since each memory bank has control units and address latch units.

SUMMARY OF THE INVENTION

Therefore, the present invention has been made to solve the problems of the conventional bank control unit of Rambus DRAM. One object of this invention is to provide a bank control circuit capable of reducing circuit area by disposing one control circuit and one address latch circuit in every two banks.

According to the present invention, the semiconductor memory device wherein a dependent bank operation is performed, comprises: a plurality of banks including memory cells; a plurality of address latch circuits, shared by two adjacent banks respectively, for receiving global address signals and latching local address signals of the selected bank; and a plurality of control circuits, shared by two adjacent banks respectively, for generating control signals and determining the specific bank that is to be activated.

As described above, according to the present invention, one control circuit and address latch circuit is shared by two banks, thereby reducing circuit area.

The above objects and other features and advantages of the present invention will become more apparent after reading the following detailed description when taken in conjunction with the drawings.

DETAILED DESCRIPTION OF THE INVENTION

Figure 1:
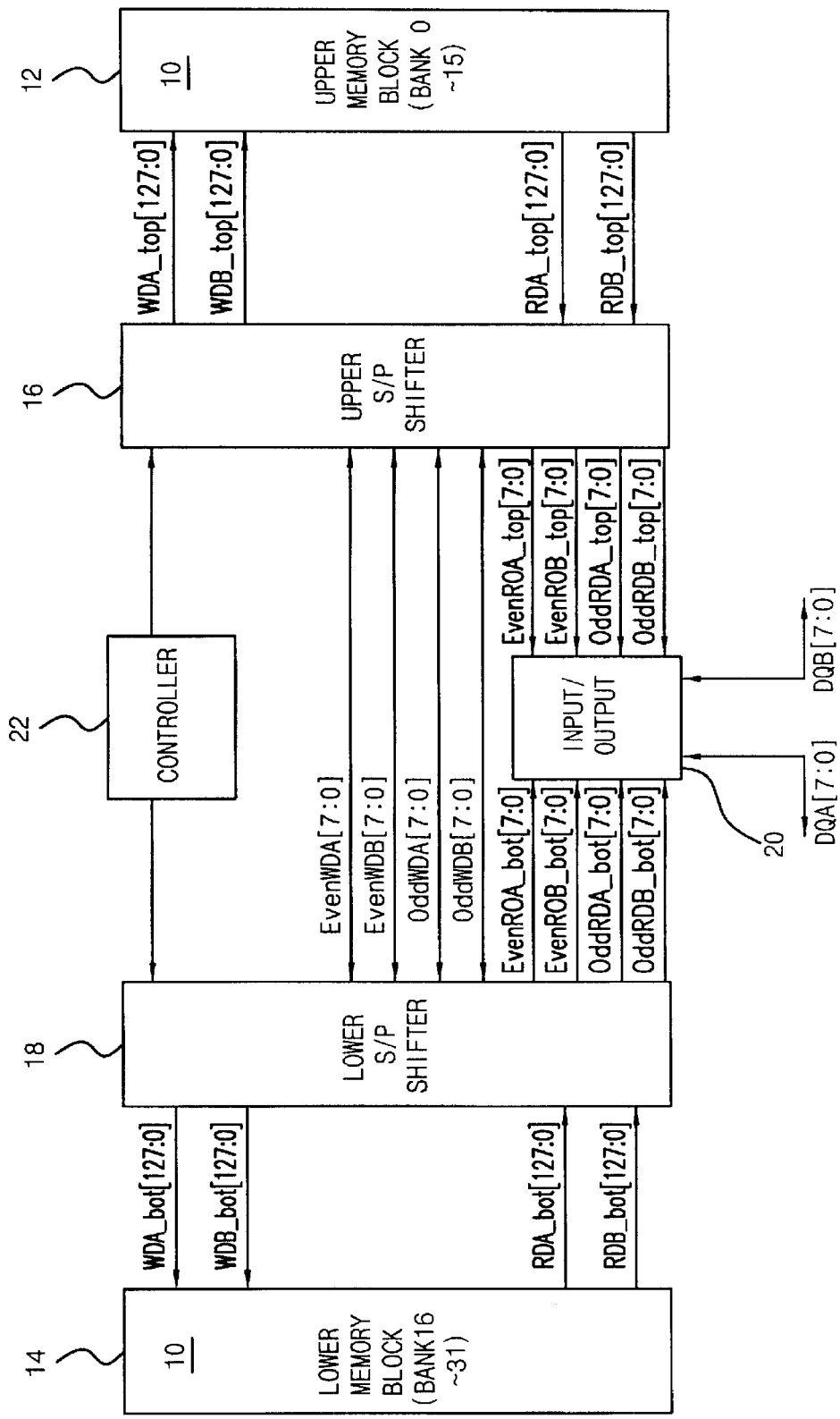
FIG. 1 is a block diagram of a conventional Rambus DRAM.
Figure 2:
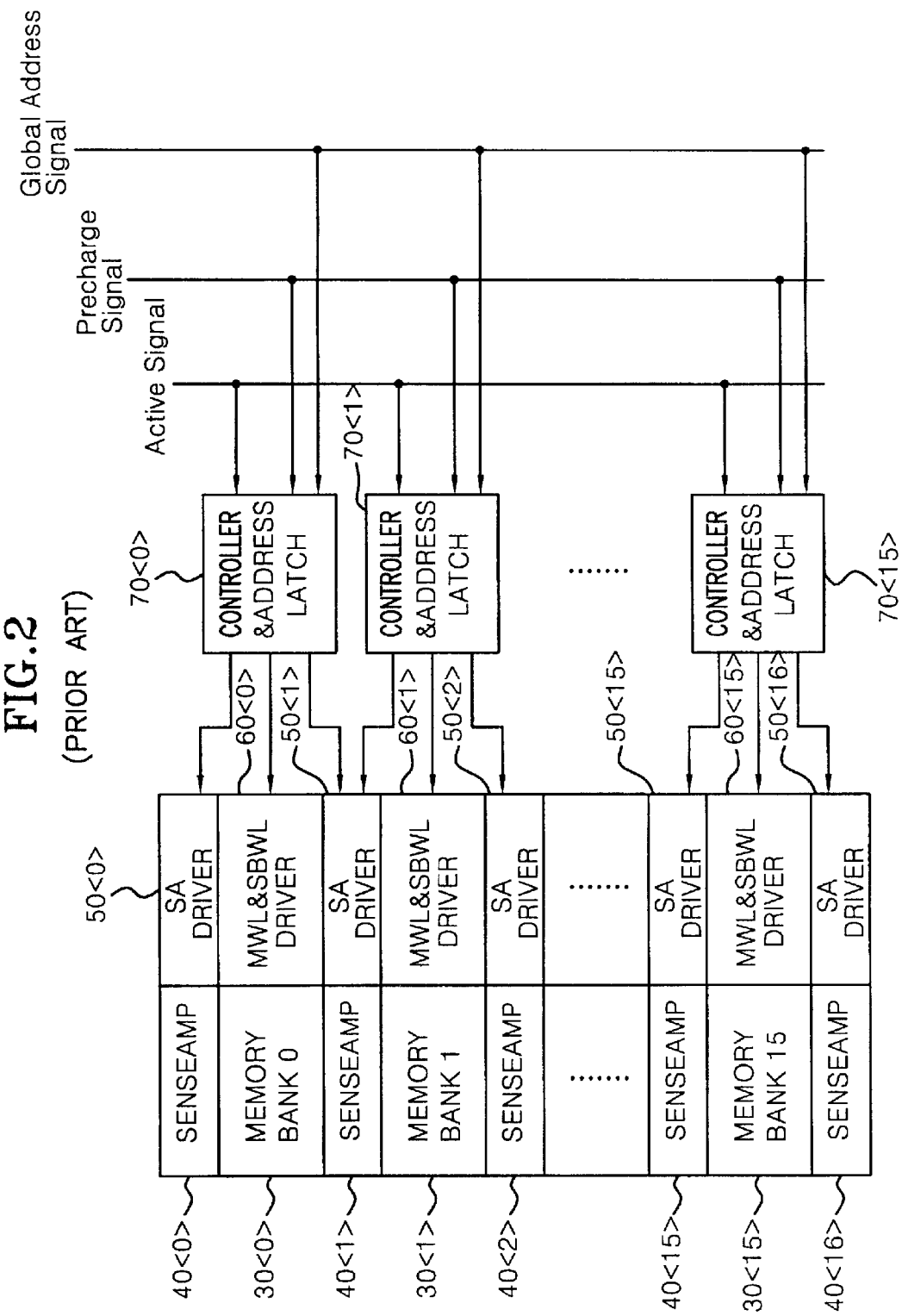
FIG. 2 is a block diagram of a conventional memory bank control circuit disposed in the memory block illustrated in FIG. 1.
Figure 3:
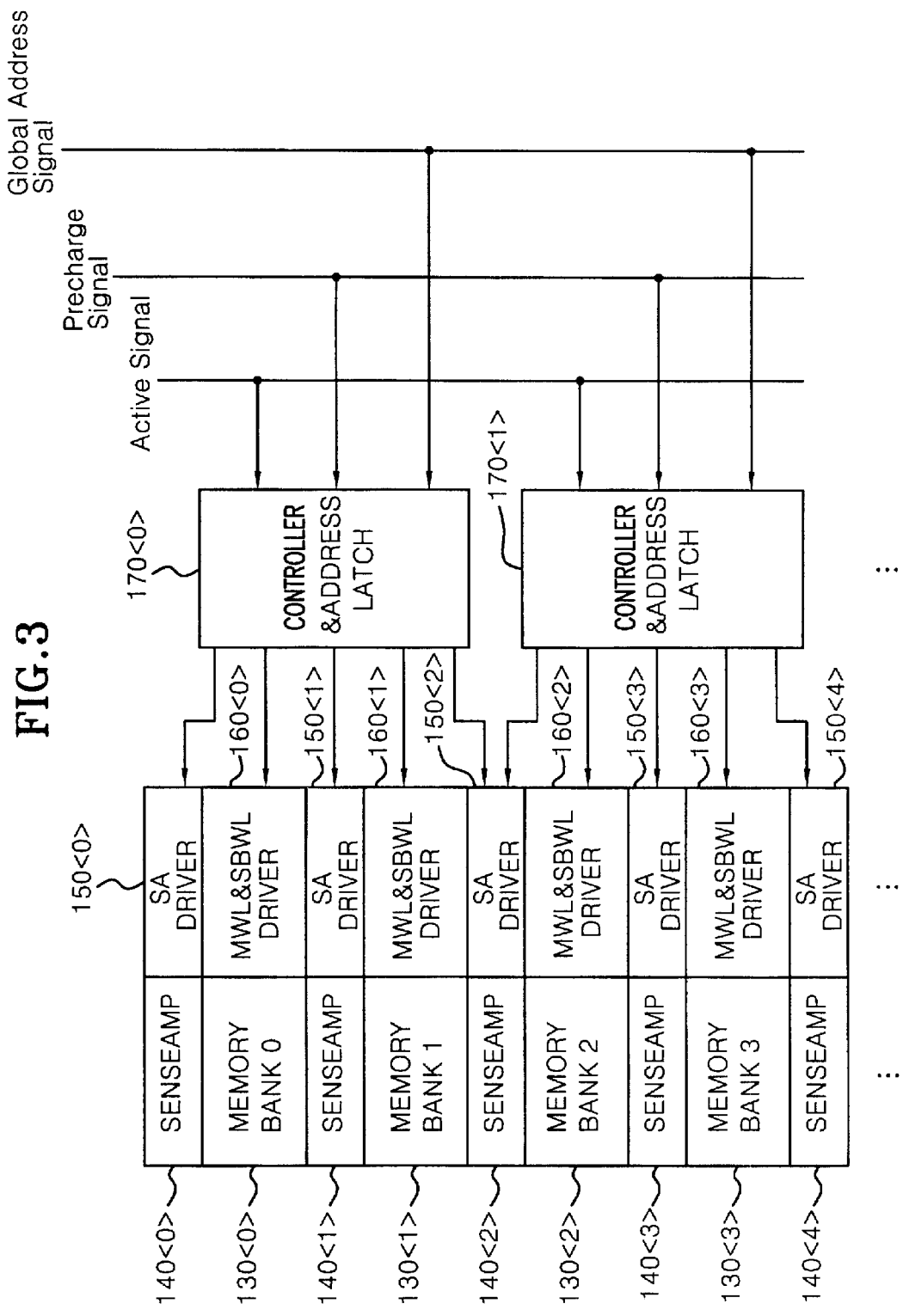
FIG. 3 is a block diagram of a bank control circuit of Rambus DRAM according to a preferred embodiment of the present invention.

FIG. 3 is a block diagram of a bank control circuit in Rambus DRAM comprising: n memory bank units 130<n> for storing data; n+1 sense amp units 140<n+1> disposed on upper and lower parts of each memory bank unit 130<n> for sensing data in write and read operations; n+1 sense amp driver units 150<n+1> for controlling operations of the sense amp unit 140<n+1>; n main word line and sub word line driver units 160<n> for driving word lines and sub word lines of the memory bank units 130<n>; and n/2 control units and address latch units 170<n/2>, one being shared by two memory bank units 130<n>, for receiving active signals, precharge signals and global address signals and for generating signals to control two sense amp driver units, two main word line and sub word line driver units and bit lines disposed in the two memory banks.

According to the present invention, two memory bank units 130<0:1> share one control unit and one address latch unit 170<n> since two banks are not activated at the same time.

First, the active signal and the precharge signal are generated as global signals and then each control unit and address latch unit 170<n> check whether the received global address signal is the address signal of the two memory banks including them. Therefore, one control unit and one address latch unit are selected by the received global address signal. And, the selected control unit and the address latch unit operate a memory bank corresponding to the received global address signal in active mode or precharge mode by the received active signal and the precharge signal.

Moreover, the selected control unit and address latch unit maintain word lines in the memory bank by latching the global address signal received in active mode although the external global address signals are changed.

Figure 4:
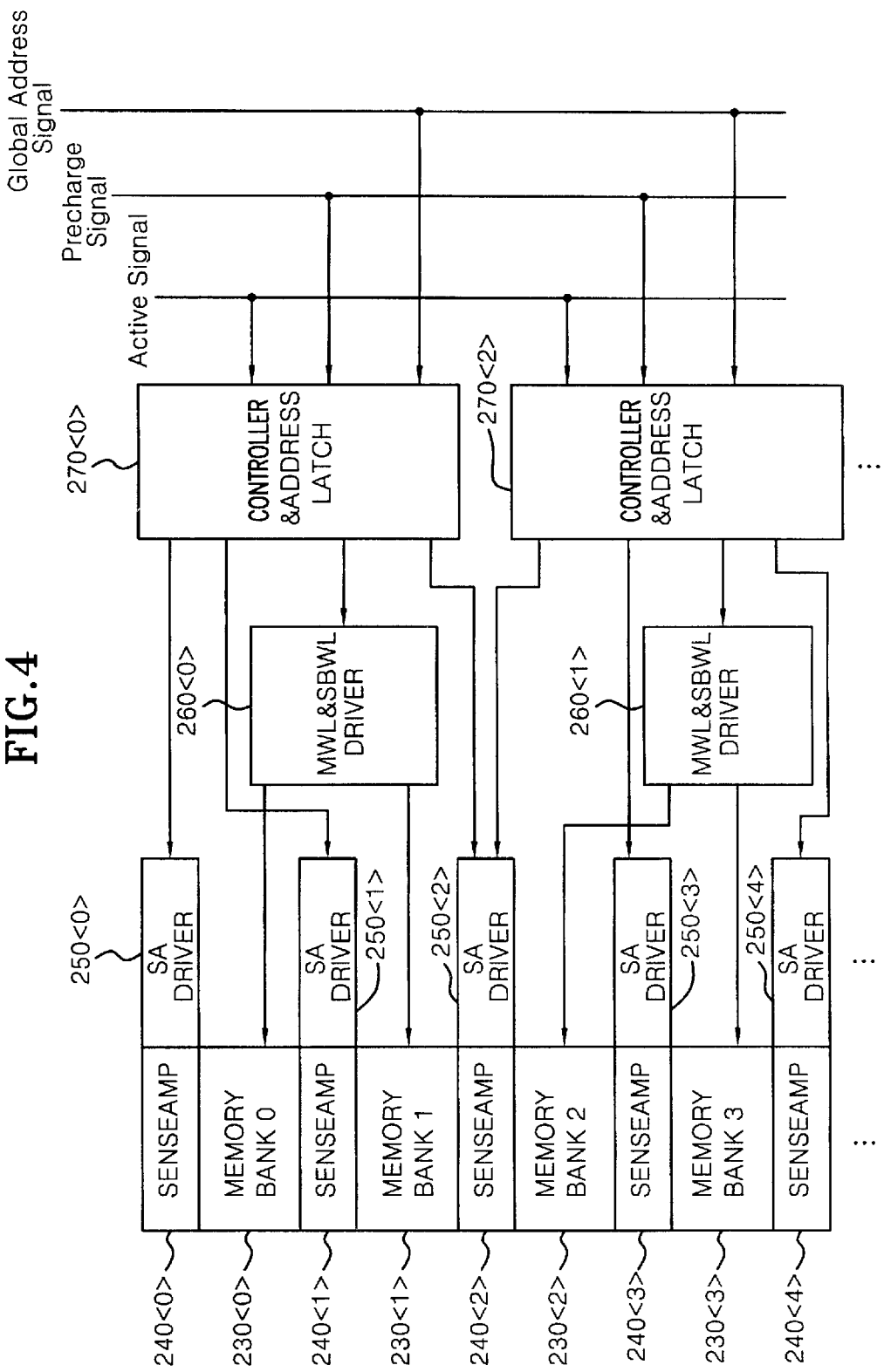
FIG. 4 is a block diagram of a bank control circuit of Rambus DRAM according to another embodiment of the present invention.

FIG. 4 is a block diagram of bank a control circuit in Rambus DRAM according to another embodiment of the present invention, comprising: n memory bank units 230<n> for storing data; a n+1 sense amp unit 240<n+1> disposed on upper and lower parts of each memory bank unit 230<n>, for sensing data in write and read operations; n+1 sense amp driver units 250<n+1> for controlling operations of the sense amp units 240<n+1>; n/2 main word line and sub word line driver units 160<n>, one being shared by two memory bank units 230<n>, for generating signals to drive word lines and sub word lines of the two memory bank units; and a n/2 control unit and an address latch unit 170<n/2>, one being shared by two memory bank units 230<n>, for receiving active signals, precharge signals and global address signals from outside and for generating signals to control two sense amp driver units, one main word line and sub word line driver unit and bit lines of the two memory banks.

According to the present invention, two memory bank units 130<0:1> share one control unit and address latch unit 170<n> and one main word line and sub word line driver unit 260<0> by the property that two banks are not activated at the same time.

First, the active signal and the precharge signal are generated as global signals and then each control unit and address latch unit 170<n> check whether the received global address signal is the address signal of the two memory banks including them. Therefore, one control unit and address latch unit are selected by the received global address signal. And, the selected control unit and address latch unit operate a memory bank corresponding to the global address signal received in active mode or precharge mode by the received active signal and precharge signal.

Moreover, the selected control unit and address latch unit maintain word lines in the memory bank by latching the global address signal received in active mode to the inner address latch circuit although external global address signals are changed.

Here, main word lines and sub word lines are driven in one memory bank corresponding to the address signal by the main word line and sub word line driver unit 260<n> receiving the global address signals latched by the control unit and address latch unit 270<n>.

As described above, according to the present invention, one control circuit and address latch circuit is shared by two banks, thereby reducing circuit area.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device for controlling memory banks comprising:

a plurality of banks including memory cells; and a plurality of control units and address latch units, each of which is shared by two adjacent banks respectively, for generating control signals to control modes of banks, receiving global address signals and determining which bank is to be selected, wherein each bank comprises corresponding word lines.

2. The semiconductor memory device for controlling memory banks according to claim 1, wherein when selecting bank n of the plurality of banks, banks n−1, n, n+1 are precharged together, and then the bank n is activated.

3. A semiconductor memory device for controlling memory banks comprising:

a plurality of memory bank units for storing data;

a plurality of sense amp units, disposed on an upper and a lower part of each memory bank, for sensing data in write and read operations;

a plurality of sense amp driver units for controlling operations of each sense amp unit; and a plurality of main word line and sub word line driver units for driving word lines and sub word lines of each memory bank, wherein the device further comprises a plurality of control units and address latch units, each of which is shared by two adjacent banks respectively, for generating control signals to control modes of banks, receiving global address signals and determining which bank is to be selected; and wherein each bank comprises corresponding word lines and sub word lines.

4. A semiconductor memory device for controlling memory banks according to claim 3, wherein the control signals are active signals and precharge signals.

5. A semiconductor memory for controlling memory banks according to claim 4, wherein each of the control units and the address latch units maintains selected word lines in the memory bank by latching the global address signal received in active mode although external global address signals are changed.

6. A semiconductor memory device for controlling memory banks comprising:

a plurality of memory bank units for storing data;

a plurality of sense amp units, disposed on an upper and a lower part of each memory bank unit, for sensing data in write and read operations; and a plurality of sense amp driver units for controlling operations of each sense amp unit, wherein the device further comprises a plurality of main word line and sub word line driver units, each of which is shared by two adjacent memory bank units, for driving word lines and sub word lines in each memory bank unit and a plurality of control units and address latch units, each of which is shared by two adjacent memory bank units, for receiving active signals, precharge signals and global address signals and for generating signals to control the sense amp driver units, and each of the word line and sub word line driver units.

7. The semiconductor memory device for controlling memory banks according to claim 6, wherein the control signals are active signals and precharge signals.

8. The semiconductor memory device for controlling memory banks according to claim 7, wherein each of the control units and the address latch units maintains selected word line in the memory bank by latching the global address signal received in active mode although external global address signals are changed.

* * * * *